United States Patent [19]

Takagi et al.

[11] Patent Number: 5,698,268

[45] Date of Patent: Dec. 16, 1997

[54] RESIN COMPOSITION FOR ELECTROLESS METAL DEPOSITION AND METHOD FOR ELECTROLESS METAL DEPOSITION

[75] Inventors: Kaneyuki Takagi, Tokyo; Toshiyuki Kita, Nara; Kazuya Satou, Osaka, all of Japan

[73] Assignee: Sankei Giken Kogyo Kabushiki Kaisya, Tokyo, Japan

[21] Appl. No.: 798,027

[22] Filed: Feb. 6, 1997

Related U.S. Application Data

[62] Division of Ser. No. 612,333, Mar. 7, 1996, abandoned.

[30] Foreign Application Priority Data

Mar. 9, 1995 [JP] Japan .................................. P7-78104

[51] Int. Cl.⁶ .............................. B05D 1/18; B05D 3/10; C23C 28/00
[52] U.S. Cl. .............................. 427/437; 427/304; 427/306; 428/625; 428/626
[58] Field of Search .............................. 427/437, 304, 427/306; 524/901

[56] References Cited

U.S. PATENT DOCUMENTS

| | | | |
|---|---|---|---|
| 3,326,833 | 6/1967 | Raley et al. | 525/214 |
| 3,681,511 | 8/1972 | Miller | 427/322 |
| 3,943,193 | 3/1976 | Miyakawa et al. | 525/215 |
| 4,048,261 | 9/1977 | Starmer | 525/215 |
| 4,144,203 | 3/1979 | Hoehne et al. | 525/171 |
| 4,443,583 | 4/1984 | Musch et al. | 525/215 |
| 5,051,477 | 9/1991 | Yu et al. | 524/525 |
| 5,055,346 | 10/1991 | Rohrbacher | 428/516 |
| 5,230,928 | 7/1993 | Tagaki et al. | 427/306 |
| 5,407,993 | 4/1995 | Lyons et al. | 525/215 |
| 5,430,093 | 7/1995 | Miyamoto et al. | 524/507 |

FOREIGN PATENT DOCUMENTS

| | | |
|---|---|---|
| 517379 | 12/1992 | European Pat. Off. . |
| 69475 | 6/1977 | Japan . |
| 6109213 | 8/1981 | Japan . |
| 68354 | 4/1984 | Japan . |

Primary Examiner—Tae Yoon
Attorney, Agent, or Firm—Armstrong, Westerman, Hattori, McLeland & Naughton

[57] ABSTRACT

Disclosed is a method for electroless metal deposition, which comprises steps of: forming, on the surface of a non-conductive body to be plated, a coating of a resin composition for the electroless metal deposition containing therein a polymer (A) having a chemical structure of at least one compound selected from the group consisting of the below-listed (a), and at least one compound selected from the group of the below-listed (b)1 and (b)2; applying a negative electrostatic voltage to the film coating of the resin composition at a temperature level above the glass transition point of said resin composition; thereafter removing the applied voltage at a temperature lower than the glass transition temperature; and successively carrying out the metal deposition steps inclusive of the catalyst imparting step and the activating step:

(a) a chemical structure, in which a part of hydrogen in the main chain of polymer is substituted with the halogen group or the nitrile group, and a chemical structure having a double bond at a portion held between the aromatic substituents in the main chain of the polymer; and (b)1 a polymer (B) having a functional group which is capable of forming a metal salt; and (b)2 a low molecular weight compound (C) having a functional group which is capable of forming a metal salt, and having complete miscibility with the polymer (A) to form one phase.

4 Claims, No Drawings

RESIN COMPOSITION FOR ELECTROLESS METAL DEPOSITION AND METHOD FOR ELECTROLESS METAL DEPOSITION

This application is a divisional of application Ser. No. 08/612,333 filed Mar. 7, 1996, now abandoned.

BACKGROUND OF THE INVENTION a) Field of the Invention

This invention relates to a resin composition suitable for a novel electroless metal deposition which does not require a corrosion step to be effected on the surface of an object to be plated, and a method for electroless metal deposition using such resin composition. More specifically, the present invention is concerned with a resin composition for the electroless metal deposition of forming a deposited metal coating which is rigidly bonded onto an object for the metal deposition, by carrying out the electroless metal deposition steps starting from the catalyst imparting step and onward, omitting the corrosion step to be effected onto the surface of the object for the metal deposition after the defattening and washing steps. Also, the present invention is concerned with a method for electroless metal deposition, by which a more rigidly bonded metal coating can be obtained by the adoption of a totally new method of surface treatment, wherein a negative high voltage is applied to the abovementioned metal deposited surface. And yet, the coated film of the resin composition according to the above-mentioned present invention is variable in its composition within a range of combination of the chemical structures as defined in accordance with the base material, such variations being applicable to many kinds of base material.

Accordingly, the present invention covers a broad range of fields of its use which requires the electroless metal deposition. Its particularly expected field of utility is on the electromagnetic shielding.

b) Description of Prior Arts

The electroless plating is carried out as a step of rendering those shaped articles of plastic material, which is usually electrically non-conductive, to be conductive for the purpose of electrolytically depositing metal on it. For this purpose, there has so far been carried out a method, in which the surface of the shaped article for the metal deposition is subjected to pre-treatment for its corrosion by any expedient to form micro corrosion pits therein, and then, by the anchor effect of the metal to be deposited in the inner surface of the micro corrosion pits by the subsequent electroless metal deposition, the metal layer as deposited is bonded to the surface of the base material.

As the method for the electroless metal deposition of plastic material, there have been publicly known various methods of using adhesive agent for the electroless metal deposition for the manufacture of printed wiring boards (such as, for example, laid-open Japanese Patent Applications No. 2-8281, No. 3-22081, etc.). Such adhesive agents for the electroless metal deposition have compositions of greater corrosion effect than the base material, hence the corrosion step is required to be done after application of the adhesive agent.

As the conventional technique in the manufacture of the material for the electromagnetic shielding, there are various methods such as applying electrically conductive coating, flame spray-coating of zinc, lamination of electrically conductive plastic charged with electrically conductive substance, or shaping a sandwich structure with this electrically conductive plastic as the core, and others. Of these methods, the application of the electrically conductive coating is the most widely used. The effects to be resulted from these methods, however, cannot be said to be satisfactory, and, even the most widely used electrically conductive coating is very expensive in price, and yet the coating must be made thick, on account of which the cost for the coating should become very high.

In recent years, the electromagnetic shielding effect of the coating obtained by the electroless metal deposition has become highly evaluated; however, this coating obtained by the electroless metal deposition is yet to be sufficiently diffused on account of the problems to be mentioned later.

The conventional method of electroless metal deposition of plastic material as mentioned in the preceding inevitably necessitates the corrosion step, at which step a treatment in mixed solution of sulfuric acid and chromic acid is generally carried out. Since this treatment uses a large amount of strong and dangerous corrosive liquid, pollution-preventive measures should be taken, and there is stringent restriction such that no facility without such preventive measures being taken is allowed to put its operation into effect, hence the economic burden of paying the public-pollution-preventing cost cannot be avoided.

Also, in order to satisfy its tight bonding with the metal deposited layer, the plastic material per se has been so modified that it can be readily corroded depending on each and every sort of resin, for which there has been used various high grade resin materials adapted to the electroless metal deposition. In this case, however, there is a problem such that a part of the inherent characteristics of the resin is sacrified, and morover, the resin itself becomes expensive.

As a way for solving these problems, there is contemplated a method of forming a coating, by which the coating obtained by the electroless metal deposition is bonded tightly, even without effecting the corrosion treatment onto the surface for the metal deposition.

For such method of metal deposition, there is disclosed in the Japanese Patent Publication No. 6-33461 a method of electroless metal deposition without carrying out the corrosion treatment, by forming on the surface for the metal deposition a coating containing therein chitosan or chitosan derivatives. Even this method, however, has its problem of insufficient bonding of the coating with the base material for the metal deposition, for supplementing of which there is further required an under-coating. In all the examples of this published patent application, there is used, without exception, the acrylic type under-coating, and there is no example of electroless metal deposition which does not use the under-coating. Also, the peeling strength of the coating is only based on the results of the cross-cut adhesion test in accordance with JIS (Japanese Industrial Standard) K-6800•8.5.

Japanese Patent Publication No. 3-51790 discloses that, as a method of improving the bonding strength of the metal layer obtained by the electroless metal deposition, when copolymers obtained from the below-listed monomers ①, ②, ③, and ④ are used as the binding agents for the activating substance to carry out the electroless metal deposition, there can be obtained the coating of good bonding property from the electroless metal deposition:

① monomer containing therein the cyano group;

② (methyl)styrene which can be ring-substituted at any time;

③ methacrylic ester; and

④ unsaturated carboxylic acid ester.

This method, however, is one that not only it relies on a complicated method of manufacturing, wherein the binder itself copolymerizes those monomers in a particular combination under pressure, nor the electroless metal deposition is effected on the coating film of this binding agent alone, but also an organic compound of an expensive precious metal, as an activating agent, is kneaded into this binding agent by means of a roller mill, etc. and used.

That is to say, this method requires the complicated manufacturing steps as mentioned above, and utilizes a composition containing a precious metal as the coating for the electroless metal deposition. Moreover, the method itself involves a problem such that, when the spray-coating is required for carrying out the metal deposition for the electromagnetic wave shielding on the two-dimensional surface, it becomes a very expensive method for the electroless metal deposition, considering that the loss of the coating material would occur.

For solving various points of problem inherent in the abovementioned conventional technique such as influence on environment, economy as well as performance, the present inventors made studies on an electroless metal deposition which does not require the corrosion step, which can be readily practised, and which is excellent in its performance and economy. As the result of their studies, three patent applications were already filed (i.e., Japanese Patent Application No. 1-198207 [Laid-Open No.3-64481]; Japanese Patent Application No. 1-334164 [Laid-Open No. 9-193881]; and Japanese Patent Application No. 2-221930 [Laid-Open No. 4-103771]). During their studies concerning the mechanism of tight bonding between the abovementioned deposited metal coating according to the present invention and the coated film, the present inventors further discovered that its bonding strength remarkably increased by the application of negative static voltage onto the coated film surface. Based on this finding, studies were further made on the resin composition, in which the effect of such static voltage application emerges remarkably. They also found out that, in these resin compositions, there existed those which can produce the deposited coating that indicated practical peeling strength, even if the electroless metal deposition was conducted directly without applying the static voltage.

Furthermore, deducing the hypotheses with respect to the mechanism of deposition and bonding of the coating film obtained by the electroless metal deposition onto the coated film of the composition according to the present invention by the negative electrostatic voltage application, to be described later, the present inventors thought that, if positive structure is contained in the main chain of the polymer, the coating film would be deposited on the coated film without application of the negative static voltage and the deposited coating adheres to the coated film. On the basis of this deduction, the present inventors made studies on such resin compositions, and finally completed the present invention having very wide range of its application.

SUMMARY OF THE INVENTION

It is therefore an object of the present invention to provide a novel resin composition for electroless metal deposition.

According to the present invention, in one aspect thereof, there is provided a resin composition for electroless metal deposition, which comprises a polymer (A) having one or two or more chemical structures selected from the below-listed group (a); and at least one of the compounds selected from the below-listed group (b)1 and (b)2:

(a) a chemical structure, in which a part of hydrogen in the main chain of polymer is substituted by the halogen group or the nitrile group, and a chemical structure having a double bond at a portion held between the aromatic substituents in the main chain of the polymer; and (b)1 a polymer (B) having a functional group which is capable of forming a metal salt; and (b)2 a low molecular weight compound (C) [hereinafter referred to simply [compound (C)] having a functional group which is capable of forming a metal salt, and having complete miscibility with said polymer (A) to form one phase.

There exist a multitude of resin compositions comprising such combination, out of which the following resin compositions have been found to exhibit their remarkable effect in that, even when the electroless metal deposition steps are conducted from the catalyst imparting step onward, dispensing with the corrosion treatment step, there can be obtained the deposited coating having its peeling strength sufficiently durable in its practical use. These resin compositions are general-purpose resin compositions for the electroless metal deposition, which are adaptable to those base materials for metal deposition (hereinafter simply referred to "base material"), composed of a multitude of different resins.

The first of its kind is: a resin composition, wherein the polymer (A) is chlorinated polypropylene with the chlorine content of 30% or below, and the polymer (B) is propylene/maleic anhydride copolymer or 1,4-polybutadiene/maleic anhydride copolymer. This resin composition has a combination of the chemical structure (a), in which a part of hydrogen in the main chain is substituted with the halogen group, and the carboxy group as the functional group which is capable of forming the metal salt of the compound (b)1.

The second of its kind is: a resin composition, wherein the polymer (A) is polychloroprene, and the polymer (B) is either polyester having at its chain ends the carboxy group and the hydroxyl group, or 1,2-polybutadiene/maleic anhydride copolymer. This resin composition has a combination of the chemical structure (a), in which a part of hydrogen in the main chain is substituted with the halogen group, and the carboxy group as the functional group which is capable of forming the metal salt of the compound (b)1.

The third of its kind is: a resin composition, wherein the polymer (A) is acrilonitrile/acrylic ester copolymer. This resin composition has a combination of the chemical structure (a), in which a part of hydrogen in the main chain is substituted with the nitrile group, and the carboxy group as the functional group which is capable of forming the metal salt of the compound (b)1.

The fourth of its kind is: a resin composition, wherein the polymer (A) is the polymer (A) is styrene/butadiene/styrene block copolymer, and the polymer (B) is either styrene/maleic anhydride copolymer or 1,4-polybutadiene/maleic anhydride copolymer. This resin composition has a combination of the chemical structure (a), in which a double bond exists at a portion held between the aromatic substituents in the main chain of the polymer, and the carboxy group as the functional group which is capable of forming the metal salt of the compound (b)1.

The fifth of its kind is: a resin composition, wherein the polymer (A) is vinyl chloride/maleic anhydride copolymer, the polymer (B) is 1,4-polybutadiene/maleic anhydride copolymer, and the compound (C) of (b)2 is aromatic carboxylic acid. This resin composition has a combination of the chemical structure (a), in which a part of hydrogen in the main chain is substituted with the halogen group, and the carboxy group as the functional group which is capable of forming the metal salt of the compound (b)1.

It is another object of the present invention to provide a novel method for electroless metal deposition which does not require the corrosion step to be effected.

According to the present invention, in another aspect thereof, there is provided a method for electroless metal deposition, which comprises steps of: forming, on the surface of a non-conductive body for the metal deposition, a coating of a resin composition for the electroless metal deposition containing therein a polymer (A) having a chemical structure of one or two or more compounds selected from the group consisting of the below-listed (a), and at least one compound selected from the group of the below-listed (b)1 and (b)2; applying a negative electrostatic voltage to the coating of the resin composition at a temperature level higher than the glass transition point of the resin composition; thereafter discharging the applied voltage at a temperature lower than the glass transition temperature; and successively carrying out the metal deposition steps inclusive of the catalyst imparting step and the activating step:

(a) a chemical structure, in which a part of hydrogen in the main chain of the polymer is substituted with the halogen group or the nitrile group, and a chemical structure having a double bond at a portion held between the aromatic substituents in the main chain of the polymer; and (b)1 a polymer (B) having a functional group which is capable of forming a metal salt; and (b)2 a low molecular weight compound (C) having a functional group which is capable of forming a metal salt, and having complete miscibility with the polymer (A) to form one phase.

In the following, further details will be explained on the practical modes of embodiment of the resin composition for the electroless metal deposition and the method for electroless metal deposition of a non-conductive body using such resin composition.

As the polymers (A) of the chemical structure, wherein hydrogen in the main chain of the group (a) is substituted with halogen, there are: chlorinated substances of homopolymer of olefin, copolymers of olefins, and polyolefins including copolymers of olefin and other monomers than olefin; homopolymer of vinyl chloride or copolymers of vinyl chloride and other monomer (vinyl monomer and diolefin); and polychloroprene, and so on.

As the polymers (A) of the chemical structure, wherein hydrogen in the main chain of the group (a) is substituted with the nitrile group, there are: a homopolymer of acrylonitrile, and copolymers of acrylonitrile monomer and other monomers (such as, for example, styrene, butadiene, acrylic acid, acrylic ester, and so forth). By the way, these copolymers may be derivatives substituted with the alkyl group, the phenyl group, and others. Further, a copolymer with diene monomer may be such one that contained therein the hydrogenated double bond.

As the polymers (A) of the chemical structure having the double bond at a portion held between the aromatic substituents in the main chain of the polymer, there are: copolymers of styrene and diene monomers (such as, for example, styrene/butadiene/styrene block copolymer [hereinafter abbreviated as "SBS"], styrene/isoprene/styrene block copolymer [hereinafter abbreviated as "SIS"], and so on. The content of styrene in these copolymers should preferably be in a range of from 30% to 40%. Of these polymers, those having higher content of styrene is preferable.

As the functional group capable of forming the metal salt of (b)1 and (b)2, there may be enumerated the carboxy group, the mercapto group, the sulfonic group, etc. Of these groups, the carboxy group is particularly preferable.

The carboxy group may, besides free acid, be metal salts or esters. As the polymers (A) containing the carboxy group, there are: polyacrylate, copolymers of maleic anhydride and various kinds of vinyl monomer, polymers having the carboxy group on their side chains, such as graft copolymers of maleic anhydride, and so on, polymers having the carboxy group at the chain ends, such as polyester. Besides these polymers (B), there may also be used ordinary compounds (C) having therein the carboxy group such as stearic acid, palmitic acid (adipic acid), and other aliphatic carboxylic acid; aromatic carboxylic acids (such as, for example, benzoic acid, phthalic anhydride, salicylic acid, thiosalicylic acid having the mercapto group together, and so on, on the condition that they contain the chemical structure of the (a) group, and that they have complete miscibility with the polymer (A) to form one phase. These compounds may be used in mixture within a range such that they may have complete miscibility with the polymers (A) having the chemical structure of the (a) group to form one phase. Particularly preferable among the above-mentioned polymer (B) are polybutadiene/maleic anhydride copolymer. This polybutadiene/maleic anhydride copolymer exhibits favorable property of electroless metal deposition by combining the same with those various kinds of polymer (A) having the chemical structure of the (a) group.

Also, the mercapto group, the sulfonic group, etc. may be those which are contained in the ordinary compounds (C) such as thiophenol, mercapto-benzothiazole, p-toluenesulfonic acid, or others, provided that they have complete miscibility with the polymers (A) having the chemical structure of the (a) group to form one phase.

For the combination of (a) and (b), those polymers belonging to the polymer (A) having the chemical structure of the (a) group and having also the functional group capable of forming the metal salt of (b)1 (such as, for example, acrylonitrile/acrylic acid copolymer, chlorinated polypropylene containing therein carboxy group, vinyl chloride/maleic anhydride copolymer, etc.) may be used singly. If and when such polymers are further used in combination with the polymers (B) of (b)1 or the compounds (C) of (b)2, remarkably good property of electroless metal deposition would be exhibited.

In the case of combination of the polymer (A) having the chemical structure of the (a) group and the polymer (B) of (b)1 having the functional group capable of forming the metal salt, both of them are required to have complete miscibility each other, if used as a coating agent. Such miscibility, however, is not necessarily required when they are used as the resin composition for shaping, provided that sufficient dispersion can be realized between them. In the case of combination of the polymer (A) having the chemical structure of the (a) group and the compound (C) of (b)2 having the functional group capable of forming the metal salt, the both are required to have the complete miscibility between them to form one phase, as mentioned in the above.

Shaped article produced from various sorts of base materials can be subjected to the electroless metal deposition without effecting the corrosion step, by applying, to the surface for metal deposition, a solution obtained by dissolving the resin composition for the electroless metal deposition according to the present invention into a solvent, thereby forming the coating film, and then applying electrostatic voltage to be mentioned later onto this coated surface. Moreover, depending upon the composition of the resin composition for the electroless metal deposition, such electroless metal deposition can be done without applying the electrostatic voltage, and yet omitting the corrosion step. In either case as mentioned above, it is indispensable to select a coating film composition having good bonding property with the base material to be used.

Among the resin compositions of the present invention, those which can be used as the shaping material in view of their mechanical properties are not required to form the coating film on their surface, but can be subjected to the electroless metal deposition as it is, as is the case with the coating film. Examples of such resin compositions are acrylonitrile/acrylate copolymer (Example 2-1), composite resin composition consisting of hydrogenated nitrile rubber and zinc polyacrylate (Example 2-3), and so forth.

Also, in an attempt to improve the bonding property between the base material and the coating film, there can be added a polymer additive which does not hinder deposition of the metal coating. Such additives are, for example, hydrogenated SBS (hereinafter abbreviated as "SEBS"), ethylene/vinyl acetate copolymer, and other elastomers to be the base material for the hot-melt type adhesive agents, and a tackifier.

The method for the electroless metal deposition according to the present invention is such one that does not require the corrosion step with respect to the abovementioned resin composition, the method comprising steps of: forming, on the surface of a base material for the metal deposition, a coating of a resin composition for the electroless metal deposition; applying a negative electrostatic voltage to the coating surface of the resin composition at a temperature level above the glass transition point of the resin composition; discharging the applied voltage at a temperature lower than the glass transition temperature; and successively carrying out the electroless metal deposition steps inclusive of the catalyst imparting step and the activating step. In case the base material consists of the resin composition according to the present invention as mentioned above, it is not necessary to form a coating of the resin composition, but the negative electrostatic voltage is applied to the base material at a temperature above the glass transition point of the coating, followed by carrying out the electroless metal deposition in the same manner as mentioned in the foregoing.

The method for applying the negative electrostatic voltage onto the surface of an object for the eletroless metal deposition consists of: disposing a grounding pole plate on the opposite side of the surface of a test specimen for the metal deposition; and then bringing a negative pole plate into contact with the surface for the metal deposition through a non-adhesive film such as "Teflon", etc. Or, it can be done in a non-contact manner by separating the pole plate from the surface for the metal deposition. In the case of the non-contact voltage application, the space interval should preferably be from about 1 to 4 mm. The wider the space interval is, the higher is required the applying voltage. In addition, it is preferable that the entire opposing surfaces of the grounding pole plate and the negative pole plate be perfectly coated with the non-adhesive film such as "Teflon", etc. to prevent electric discharge between both pole plates.

The temperature, at which the electrostatic voltage is applied, should essentially be higher than the glass transition point of the coating of the resin composition for the electroless metal deposition according to the present invention, when the coating of the resin composition or the surface of the shaped article is in its dried state, containing therein no solvent. A temperature lower than this level is not preferable, because no orientation of the polar group can be envisaged at a temperature below this level. The voltage to be applied should necessarily be from 2 to 6 KV. For obtaining the same effect, the voltage may be higher when the temperature is lower, and the voltage may be lower when the temperature is higher.

The reason for making a difference between the temperature for discharging the applied voltage and the temperature for applying the voltage, by reducing the former lower than the latter, is to prevent the orientation effect due to the voltage application from being decreased, in the case of the voltage removal, which exhibits a negative effect when the voltage is removed at the same temperature level as at the time of the voltage application and without reducing the voltage to be applied. A preferred temperature for removing the applied voltage should theoretically be a temperature below the glass transition point, although there is no necessity for such limitation, but a sufficient temperature difference existing between the temperature at the time of the voltage application and the temperature at the time of the voltage removal would meet the purpose. It has been ascertained that such temperature difference could experimentally be 50° C. without problem. It is also preferable that the voltage removal should be done at a low voltage.

As the method for forming the coating of the resin composition according to the present invention, there can also be adopted, besides the abovementioned method of applying the electrostatic voltage after coating and drying, a non-contact method of applying such electrostatic voltage in the course of forming the coating. In the case, for example, of applying the coating agent containing the resin composition according to the present invention to the surface for the metal deposition, if and when the object to be coated is a shaped article of the resin composition per se, there is no necessity for temperature increase in the state of the solvent still remaining on the surface for the metal deposition, immediately after wetting the surface with the solvent, but the coated surface is dried while applying the electrostatic voltage in a non-contact manner, whereby the coating with improved property of electroless metal deposition can be formed (cf. Example 3-10).

For example, when ABS resin is used as the base baterial, the temperature of 80° C. for the voltage application and the temperature of 30° C. for the voltage removal is adopted, after formation of the coating. This application and removal of the voltage can be done, in the laboratory, by placing the base material, on which the coating has been formed, in an oven, then applying the voltage thereto, and taking out the base material from the oven as it is for cooling down, and finally removing the applied voltage. In order to perform this voltage application and removal operations continuously in an industrialized scale, if the base material is in a continuous sheet or shaped article in plate form, the metal deposited surface is heated by means of a tunnel type hot air heating device or an infra-red ray irradiating device, then the base material is caused to pass between and through the negative pole plate and the grounding pole plate, while applying the electrostatic voltage thereto, and it is cooled with cold air, while it is running between and through pole plates.

In case the base material is a shaped article, the surface for metal deposition is heated in the same manner as described in the preceding, after which cool air is caused to blow through net-mesh of the pole plate made of metal net, etc. of a shape similar to the metal deposition surface to thereby cool down the base material, while applying the electrostatic voltage thereto. The same manner may be adopted in the application of the electrostatic voltage to the base material, where the surface for the metal deposition is in the wet condition with the solvent as mentioned above. In this case, the surface for the metal deposition is not required to be heated, but hot air is simply blown to accelerate drying of the solvent.

The base material, on which the coating agent composed of the resin composition for the electroless metal deposition according to the present invention, and to which the electroless metal deposition method of the present invention cab be directly applied, spans over very broad range from general-purpose resins such as polypropylene, etc. to thermoplastic resin and thermosetting resin such as polyimide and other super-engineering plastics. Further, a primer is considered for use in an attempt to improve the bonding property between the coating agent and the base material, there are a lot of hidden possibilities of application to all kinds of non-conductive raw materials ranging from ceramics, glass and other artifical raw materials to wood, leather, and other natural raw materials.

As has been described in the foregoing, when the negative electrostatic voltage is applied to the surface of the coated film or shaped article of the resin composition having a combination of the chemical structure of (A) and the functional group of (B), the peeling strength of the metal deposited coating increases in comparison with a case where no electrostatic voltage is applied. The reason for this is considered to be as follows.

The nitrile group and the halogen atoms to be substituted with the hydrogen atoms in the main chain of the chemical structure (A) possess strong electro negativity, which, when the negative electrostatic voltage is applied thereto at a temperature level above the glass transition point, is oriented in the direction opposite to the voltage applying surface, whereby the electrostatic voltage applying surface side of the carbon atom, to which these substituents are bonded, assumes strong positivity.

Further, the effect of the double bond at the portion held between the aromatic substituents in the main chain may be considered as follows.

Even in a repetitive structure of a unit, wherein the aliphatic chain without the double bond and the aromatic substituents group are bonded, there is a difference in distribution of the electron density between the portion of the aromatic ring and the portion of the aliphatic chain, the latter portion being of a low electron density. Further existence of the double bond between the aromatic rings would have mobile π-electron which is distributed vertically to the bond surface, the π-electron moves to the opposite side to the voltage applying surface by the application of the negative voltage, whereby the portion existing between the aromatic rings in the voltage application surface further decreases its electron density.

Microscopic consideration of the state of distribution of the electron density in the voltage applying surface leads us to an assumption such that the negative substituents and certain portions of the double bonds have lower electron density than other portions, due to the orientation of the functional group of the abovementioned chemical structure (A) and the moving of the π-electron, and that, when the electron distribution state of the surface is expressed three-dimensionally, the portion takes the form of hollows, which will hereinafter be called tentatively "electron hollows".

When the surface with the "electron hollows" is immersed in a catalytic solution consisting of a mixture of palladium chloride and stannous chloride, wherein palladium forms a negative complex ion, this palladium-containing complex ion is considered to be caught into this "electron hollow", and reduced by stannous chloride in the acidic solution to become metallized to be coupled with the functional group of (B) to exhibit strong peeling strength.

This thought also applies to the inventions made by the present inventors, for which applications were already filed (Japanese Patent Applications No. 1-334164 and No. 2-221930). That is to say, these inventions differ from the present invention in that they do not have the chemical group which reacts with metal to form salt as its essential component, and that distribution of the electron density of the molecules are not forced to vary by the electrostatic voltage application. However, from the relationship among the composition of the coating agent for the electroless metal deposition, the coating agent, and the base material, it is assumed that, using the abovementioned term of "electron hollow", a shallow "electron hollow" is formed in the coating surface. Where there is the "electron hollow", good adhesion of palladium is realized, even if the hollow is shallow, and the thin coating of the electroless metal deposition is considered to exhibit its bonding strength which is durable against the cross-cut adhesion test.

With a view to enabling those persons skilled in the art to put the present invention into practice, the following preferred examples are presented, which will be read, for better understanding of the invention.

EXAMPLES

The following examples concretely explain the effect of the electroless metal deposition of the resin composition containing therein different kinds of the chemical structure (a) and the functional group (b) in combination. The experimental procedures, the method of evaluation, and the base materials for the coating specimen are as follows.

1. Experimental Procedures:
(1) Preparation of Specimens Coated with Coating Agents for Electroless Metal Deposition An injection-molded test specimen of thermoplastic resin or a press-shaped test specimen of thermosetting resin, each having thickness of 2 to 3 mm, was cut into a size of 25 mm×70 mm. Onto each of these specimens, costing agents according to the present invention, each of which was prepared in each example, were applied by means of a spray gun in one reciprocating movement (with coating thickness of approx. 2 μm), except for special case, followed by drying the coating at a normal temperature.

(2) Static Voltage Application and Removal Methods

Unless otherwise specified, the method is in accordance with the contact application method. That is to say, the test specimen prepared in accordance with the method as described in the abovementioned paragraph (1) and coated with the coating agent was held between a negative pole plate and a grounding pole plate with the mutually opposing surfaces being completely covered with a teflon film, and with its coated surface facing to the negative pole plate. The two pole plates holding therebetween the test specimen was further pinched with two sheets of slide glass for microscope observation, and fixed with a clip. This test specimen was placed in a thermostatic vessel which was temperature-elevated to a predetermined temperature. After 15 minutes lapse, a negative voltage of 6 KV was applied by a d.c. high voltage generator 8. After 30 seconds' lapse, the specimen was taken outside with the voltage having been kept applied, and then cool air was blown against it to be cooled down to a room temperature (measured with a radiation thermometer), thereby removing the applied voltage. By the way, in the examples that will follow, both non-contact voltage application method and electrostatic voltage application method are explained in detail. However, where there is described no space interval between the pole plate and the specimen coating surface, it is understood to be 1.2 mm The method is effected by holding the cut piece of glass as a spacer, between both end parts of the test specimen.

(3) Electroless Metal Deposition Method

Chemical Liquid Used:

Defattening Agent: ACE-CLEAN A220 (product of Okuno Seiyaku Kogyo K.K., Japan)

Catalytic Liquid: CATALYST C (product of Okuno Seiyaku Kogyo K.K., Japan)

Reaction Accelerator: Hydrochloric Acid

Electroless Copper Deposition Liquid: TSP 810 (product of Okuno Seiyaku Kogyo K.K., Japan Electrolytic Copper Deposition Liquid: ELECOPPER 11 (product of Okuno Seiyaku Kogyo K.K., Japan Electroless Nickel Deposition Liquid for Electromagnetic Wave Shielding: TSP 48 (product of Okuno Seiyaku Kogyo K.K., Japan)

Metal Deposition Conditions #1 (for 90° peeling test):

defattening (at 50° C. for 5 min.)—rinsing—immersion into catalytic liquid (at normal temp. for 5 min.)—immersion into reaction accelerator liquid (at normal temp. for 5 min.)—rinsing—hot water bath (at 50° C. for 1 min. immersion)—immersion into electroless copper plating liquid (at 50° C. for 10 min.)—rinsing—drying Two parallel incisions with a space interval between them of 10 mm and a length of 50 mm or longer for each were incised on the metal deposition coating of the test piece for the purpose of forming the peeling test location. Then, another incision was made at the terminal end of these parallel incisions in the direction perpendicular thereto. The test specimen with these incisions was subjected to the electrolytic copper deposition under the following conditions with the thickness of the metal coating being made about 40 μm.

Electrolytic Copper Deposition (at 25° C., for 90 min., 3 amp./dm2)

Metal Deposition Conditions #2 (for electromagnetic wave shieding):

(same as "Metal Deposition Conditions #1" upto and including "immersion into hot water bath") immersion into electroless copper deposition liquid (at 50° C. for 15 min.)—washing—immersion into catalytic liquid (at room temp. for 5 min.)—immersion into reaction accelerator liquid (at room temp. for 5 min.)—immersion into electroless nickel plating liquid (at 50°–55° C. for 5 min.)—washing—drying 2. Method for Evaluation:

The bonding strength was evaluated in accordance with the under-mentioned method, for each of the test specimens prepared under the "Metal Deposition Conditions #1" and "Metal Deposition Conditions #2".

(1) Test Specimen Under Metal Deposition Conditions #1:

In accordance with JIS (Japanese Industrial Standard) H 8630 [Bonding Property Test on Metal Deposited on Plastics]

(2) Test Specimen Under Metal Deposition Conditions #2:

In accordance with JIS (Japanese industrial Standard) K 6400 8.5 [Adhesion Test of Paint Coating—Cross-Cut Tape Method Adhesion Test]

3. Base Material for Coating Specimen

Types of resin used as the base material as well as their description are shown in Table 1 below. As for the types of resin, use was made of the symbols as defined in accordance with JIS K 6869-1992 (corresponding to ISO 1043-1:1987).

TABLE 1

| Type of Resin | Manufacturer | Tradename | Desctipt | Content |
|---|---|---|---|---|
| ABS (1) | Sumitomo Dow | KRALASTIC | AN 450 | UL VO |
| ABS (2) | Mitui-Toatu | SUNTAC | UT 61 | general-purpose |
| Heat Resistant ABS | " | PLANEROY | NH 1200 | |
| (PS + PPE) | Nihon G.E. | NORYL | N 190 J | UL VO |
| PC # (1) | Nihon G.E. | LEXAN | 100 | general-purpose |
| PC # (2) | Nihon G.E. | LEXAN | 940 | UL VO |
| (PC + ABS) | Teijin Kasei | MULTIRON | MK 100A | for plating |
| PBT | Nihon G.E. | BARROCKS | 750 | GF + M |
| PA 6.6 | Showa Denko | TECHNIL | B216V331 | GF 30% |
| (PA + PPE) | Nihon G.E. | GTX | 620 | |
| (PC + PBT) | Nihon G.E. | XENOY | 1102 | |
| PP (1) | Mitui-Toatu | MITUI-NOBLEN | X-668 | for bumper |
| PP (2) | Mitui-Toatu | MITUI-NOBLEN | BJHH-MC20 | charged with 20% mica |
| PVC | Mitui-Toatu | | | |
| PES | Mitui-Toatu | | E 3010 | |
| PI - T | Mitui-Toatu | AURAM | natural | |
| UP | | | | SMC |
| EP | | | | paper impreg. |
| PF | | | | GF impreg. |
| PUR - T | available in general mkt. | | | thermoplastic polyurethane resin |

: PC injection-molded specimen was used after 1-hour annealing at 130° C.

Example 1

A polymer having the chemical structure (a) was divided into three sections of: halogen-containing polymer; nitrile group containing polymer; and a polymer having a double-bond between the aromatic substituents. The polymer belonging to each section is combined with the functional group of (b) to prepare the coating agent. Then, each coating agent was applied onto different kinds of base material to obtain coated test specimens. These test pieces of various examples were subjected to the electroless metal deposition tests, the results of which are tabulated for each section and shown in Tables 2 to 4. The resin components of the coating agents are indicated in accordance with the abovementioned JIS symbols. In the tables, those numerals with asterisk (*) mark denote those examples of cases, wherein, in the same combination of the compounds (a) and (b) for the purpose of comparison, the electrostatic voltage was not applied.

Section 1 (Examples Using Halogen-Containing Polymer as the Principal Constituent: Examples 1-1 to 1-17)

Example 1-1

0.5 part by weight of low chlorinated polypropylene (hereinafter abbreviated as "LCPP") [Remark 1-1], 1.5 parts by weight of polyester type adhesive agent [Remark 1-2], and 3 parts by weight of SEBS were dissolved into 95 parts by weight of toluene to thereby prepare the coating agent.

The resin, to which the coating agent was applied: PP [1]; temperature for electrostatic voltage application: 100° C.

Example 1-2

2% by wt. toluene solution of carboxy group-containing LCPP [Remark 1-3] was made the coating agent.

The resin, to which the coating agent was applied: PP [1]; temperature for electrostatic voltage application: 100° C.

Example 1-3

2.25 parts by weight of carboxy group-containing LCPP [Remark 1-3], and 0.25 parts by weight of stearic acid were dissolved into 97.5 parts by weight of toluene to thereby prepare the coating agent.

The resin, to which the coating agent was applied, and the temperature for electrostatic voltage application were exactly same as those in Example 1-2 above, with the exception that the conditions for the electrostatic voltage application was the non-contact application.

Example 1-4

0.5 part by weight of carboxy group-containing LCPP [Remark 1-3], 1 part by weight of thio-salicylic acid, 2.5 parts by weight of ethylene/vinyl acetate copolymer (hereinafter abbreviated as "E/VAC") [Remark 1-4], and 1 part by weight of ester gum [Remark 1-5] were dissolved into toluene to thereby prepare the coating agent.

The resin, to which the coating agent was applied, and the temperature for electrostatic voltage application were exactly same as those in Example 1-2 above.

Example 1-5

1.5 parts by weight of carboxy group-containing LCPP [Remark 1-3], and 3.5 parts by weight of propylene/maleic anhydride copolymer (hereinafter abbreviated as "P/MA") [Remark 1-6] were dissolved into 95 parts by weight of toluene to thereby prepare the coating agent.

The resin, to which the coating agent was applied: PP (1) and PP(2); temperature for electrostatic voltage application: 100° C.

Example 1-6

0.8 part by weight of carboxy group-containing LCPP [Remark 1-3], 1.2 parts by weight of P/MA [Remark 1-6], 2.0 parts by weight of E/VAC [Remark 1-4], and 1.0 part by weight of rosin-modified phenolic resin [Remark 1-7] were dissolved into 95 parts by weight of toluene to thereby prepare the coating agent.

The resin, to which the coating agent was applied, and the temperature for electrostatic voltage application were exactly same as those in Example 1-5 above.

Example 1-7

3 parts by weight of carboxy group-containing LCPP [Remark 1-3], and 2 parts by weight of 1,4 polybutadiene maleic anhydride copolymer(hereinafter abbreviated as "MAPB 1,4") [Remark 1-8] were dissolved into 95 parts by weight of toluene to thereby prepare the coating agent.

The resin, to which the coating agent was applied, and the temperature for electrostatic voltage application were exactly same as those in Example 1-5 above, with the exception that the conditions for the electrostatic voltage application was the non-contact application.

Example 1-8

5% by wt. tetrahydrofuran (hereinafter abbreviated as "THF") solution of vinyl chloride/maleic anhydride copolymer (hereinafter abbreviated as (VC/MA) [Remark 1-9] was made the coating agent.

This coating agent was applied to ABS(1) and PC(1). The temperature for electrostatic voltage application was 80° C. for ABS(1), and 120° C. for PC(1).

Example 1-9

An example of further addition of a compound containing therein a functional group of (B) in the above-described example:

4 parts by weight of VC/MA [Remark 1-9] and 1 part by weight of salicylic acid were dissolved into 95 parts by weight of THF to thereby prepare the coating agent.

The resin, to which the coating agent was applied, and the temperature for electrostatic voltage application were exactly same as those in Example 1-8 above.

Example 1-10

In place of salicylic acid used in Example 1-9 above, thio-phenol was blended. The method for preparing the coating agent, the resin, to which the coating agent was applied, and the temperature for the electrostatic voltage application were all the same as those in Example 1-9 above.

Example 1-11

In place of salicylic acid used in Example 1-9 above, thio-salicylic acid was blended. The method for preparing the coating agent was the same as in Example 1-9 above. The resin, to which the coating agent was applied: ABS(1), ABS(2), PVC, PC(1), PC(2), (PC+PBT), (PA+PPE), PES, PF. The temperature for the electrostatic voltage application: 80° C. for ABS and PVC, and 120° C. for the remaining resins.

Example 1-12

4 parts by weight of VC/MA [Remark 1-9] and 1 part by weight of polyester type adhesive agent [Remark 1-2] were dissolved into 95 parts by weight of THF to thereby prepare the coating agent.

The resin, to which the coating agent was applied: PVC and PV(1). The temperature for static voltage application: 80° C. for PVC, and 120° C. for PC(1).

Example 1-13

4 parts by weight of VC/MA [Remark 1-9] and 1 part by weight of p-toluene sulfonic acid were dissolved into 95 parts by weight of THF to thereby prepare the coating agent.

The resin, to which the coating agent was applied: (PC+ABS). The temperature for non-contact electrostatic voltage application: 120° C.

Example 1-14

3 parts by weight of VC/MA [Remark 1-9] and 2 parts by weight of MAPB 1,4 [Remark 1-8] were dissolved into 95 parts by weight of THF to thereby prepare the coating agent.

The resin, to which the coating agent was applied: (PC+ABS), PC(2), (PA+PPE), and EP. The temperature for non-contact electrostatic voltage application: 120° C.

Example 1-15

1.5 parts by weight of chloroprene [Remark 1-10] and 3.5 parts by weight of polyester type adhesive agent [Remark 1-2] were dissolved into 95 parts by weight of toluene to thereby prepare the coating agent.

The resin, to which the coating agent was applied: PBT, PC(1), UP, PF, and PUR-T (thermoplastic polyurethane resin). The temperature for electrostatic voltage application: 120° C. for PC, PBT, UP, and PF, and 80° C. for PUR-T.

Example 1-16

1.5 parts by weight of chloroprene [Remark 1-10] and 3.5 parts by weight of 1,2-polybutadiene/maleic anhydride copolymer (hereinafter abbreviated as "MAPB 1,2") [Remark 1-11] were dissolved into 95 parts by weight of toluene to thereby prepare the coating agent.

The resin, to which the coating agent was applied: (PC+PBT) and UP. The temperature for non-contact electrostatic voltage application: 120° C.

Example 1-17

1.5 parts by weight of high chlorinated polypropylene (hereinafter abbreviated as "HCPP") [Remarks 1-12] and 3.5 parts by weight of styrene/maleic anhydride copolymer (hereinafter abbreviated as "SMA") [Remark 1-13] were dissolved into 95 parts by weight of methylethyl ketone (hereinafter abbreviated as "MEK") to thereby prepare the coating agent.

The resin, to which the coating agent was applied: ABS(1) and (PC+ABS). The temperature for electrostatic voltage application: 80° C. for ABS(1) and 120° C. for (PC+ABS).

[Remark 1-1] Product of Nihon Seishi K.K. "SUPER-CURON 803 MW" (low chlorinated polypropylene with chlorine content of 29.5%)

[Remark 1-2] Product of Toyo Boseki K.K. "BYRON 300" (copolymerized polyester with —COOH and —OH at both chain ends)

[Remark 1-3] Product of Nihon Seishi K.K. "SUPER-CURON 822" (carboxy group-containing low chlorinated polypropylene with chlorine content of 24.5%)

[Remark 1-4] Product of Mitsui-Sekiyu Kagaku K.K. "EVERFLEX 450" (ethylene/vinyl acetate copolymer with vinyl acetate content of 45%)

[Remark 1-5] Product of Arakawa Kagaku K.K. "ESTER GUM AAV" (rosin ester)

[Remark 1-6] Product of Mitsui-Toatsu Kagaku K.K. "MALEINATED PP" (propylene/maleic anhydride copolymer with maleic anhydride content of 15%)

[Remark 1-7] :Product of Arakawa Kagaku K.K. "TAMANOL 145" (rosin-modified phenolic resin)

[Remark 1-8] Product of Nihon Soda K.K. "SOLID MALEINATED" 1,4 POLYBUTADIENE AN4120 (maleic anhydride content of 20%)

[Remark 1-9] Product of Japanese Zeon Co. Ltd. "Adhesive PVC Resin for Coating 400X110A" (vinyl chloride/maleic anhydride copolymer with maleic anhydride content of approx. 5% [an estimated value])

[Remark 1-10] Product of Denki Kagaku Kogyou K.K. "DENKA CHLOROPRENE M30" (general-purpose chloroprene with Mooney's viscosity of 38±4)

[Remark 1-11] Product of Nihon Soda K.K. "SOLID MALEINATED 1,2 POLYBUTADIENE AN2120" (maleic anhydride content of 20%)

[Remark 1-12] Product of Asahi Denka K.K. "ADECA-PRENE CP-1" (high chlorinated polypropylene with chlorine content of 64&)

[Remark 1-13] Product of Arco Chemical Co. Ltd. "DYLARK D350" (impact resistant styrene/maleic anhydride copolymer with maleic anhydride content of 15%)

TABLE 2

| Ex. No. | Combination (A) | (B) | Base Material | Peeling Strength (kg/cm) | Adhesivity of Coating for Electromagnetic Wave Shield |
|---|---|---|---|---|---|
| 1-1 | LCPP | polyester type adhesive agent | PP(1) | 0.3–0.4 | 100/100 |
| 1-2 | LCPP | (carboxy-group containing) - stearic acid | PP(1) | 0.1 or lower | 100/100 |
| 1-3 | " | (carboxy-grpu containing) - stearic acid | PP(1) | 0.4–0.6 | 100/100 |
| 1-4 | " | thio-salicyclic acid (provided that an adhesivity improving resin with PP as added) | | | |
| | | | PP(1) | 0.3–0.4 | 100/100 |
| 1-5 | " | P/MA | PP(1) | 1.4–1.6 | 100/100 |
| " | " | " | PP(2) | 0.3–0.4 | 100/100 |
| 1-5* | " | " | PP(1) | 1.0–1.2 | 100/100 |
| 1-6 | " | " | (provided that an adhesivity improving resin with PP was added) | | |
| | | | PP(1) | 0.5–0.7 | 100/100 |
| " | " | " | PP(2) | 0.5–0.7 | 100/100 |
| 1-7 | " | MAPB 1,4 | PP(1) | 1.8–2.1 | 100/100 |
| " | " | " | PP(2) | 0.9–1.0 | 100/100 |
| 1-7* | " | " | PP(1) | 1.2–1.5 | 100/100 |
| 1-7* | " | " | pp(2) | 0.6–0.7 | 100/100 |
| 1-8 | VC/MA | — | ABS(1) | 0.4–0.8 | 100/100 |
| " | " | — | PC(1) | 0.6 | 100/100 |
| 1-9 | " | salicylic acid | ABS(1) | 0.8–0.9 | 100/100 |
| " | " | salicylic acid | PC(1) | 0.7–0.8 | 100/100 |
| 1-10 | " | thiophenol | ABS(1) | 0.9–1.0 | 100/100 |
| " | " | " | PC(1) | 0.8–1.2 | 100/100 |
| 1-11 | " | thiosalicylic acid | ABS(1) | 1.5–2.0 | 100/100 |
| " | " | thiosalicylic acid | ABS(2) | 1.2–1.7 | 100/100 |
| " | " | thiosalicylic acid | PVC | 0.7–0.9 | 100/100 |
| " | " | thiosalicylic acid | PC(1) | 1.2–1.5 | 100/100 |
| " | " | thiosalicylic acid | PC(2) | 1.1–1.2 | 100/100 |
| " | " | thiosalicylic acid | PC + ABS | 1.0–1.1 | 100/100 |
| " | " | thiosalicylic acid | PC + PBT | 0.2–0.3 | 100–100 |
| " | " | thiosalicylic acid | PA + PPE | 0.8 + 1.0 | 100/100 |
| " | " | thiosalicylic acid | PES | 0.2–0.3 | 100/100 |
| " | " | thiosalicylic acid | PF | 0.4–0.5 | 100/100 |
| 1-11* | " | thiosalicylic acid | ABS(1) | 1.2–1.5 | 100/100 |
| 1-12 | " | polyester type adhesive agent | PVC | 0.4–0.5 | 100/100 |
| " | " | polyester type adhesive agent | PC(1) | 1.0–1.2 | 100/100 |
| 1-12* | " | polyester type adhesive agent | PC(1) | 0.2–0.3 | 100/100 |
| 1-13 | VC/MA | p-toluene sulfonic acid | PC + ABS | 0.3–0.6 | 100/100 |
| 1-14 | " | MAPB 1,4 | PC + ABS | 1.6–1.7 | 100/100 |
| " | " | " | PC(2) | 1.2–1.6 | 100/100 |
| " | " | " | PA + PPE | 0.8–0.9 | 100/100 |
| " | " | " | EP | 0.9–1.1 | 100/100 |
| 1-14* | " | " | PC + ABS | 0.9–1.1 | 100/100 |
| 1-14* | " | " | EP | 0.6–0.7 | 100/100 |
| 1-15 | chloroprene | polyester type adhesive agent | PBT | 0.8 | 100/100 |

TABLE 2-continued

| Ex. No. | Combination (A) | Combination (B) | Base Material | Peeling Strength (kg/cm) | Test Results of Electroless Metal Deposition — Adhesivity of Coating for Electromagnetic Wave Shield |
|---|---|---|---|---|---|
| | chloroprene | polyester type adhesive agent | PC(1) | 0.7–0.8 | 100/100 |
| | chloroprene | polyester type adhesive agent | UP | 0.5–0.6 | 100/100 |
| | chloroprene | polyester type adhesive agent | PF | 0.3–0.4 | 100/100 |
| | chloroprene | polyester type adhesive agent | PUR-T | 0.4–0.7 | 100/100 |
| 1-16 | chloroprene | MPAB 1,2 | PC + PBT | 0.9 | 100/100 |
| | chloroprene | " | UP | 0.6 | 100/100 |
| 1-16* | chloroprene | " | PC + PBT | 0.8 | 100/100 |
| 1-17 | HCPP | SMA | ABS(1) | 0.3 | 100/100 |
| | " | " | PC + ABS | 0.3–0.5 | 100/100 |

NOTE:
In the Table, those numerals with (*) mark denote the Examples, where no electrostatic voltage application was effected. Same applied to other Tables. Section 2 (Examples Using Nitrile Group-Containing Polymer as the Principal Constituent: Examples 2-1 to 2-3)

Example 2-1

Test pieces were prepared from pressed sheet of acrilonitrile/acrylic acid ester copolymer (hereinafter abbreviated as "A/A") [Remark 2-1]. The surfaces of these test pieces were washed with isopropyl alcohol (hereinafter abbreviated as "IPA"), followed by electrostatic voltage application at a temperature of 110° C.

Example 2-2

8 parts by weight of A/A powder used in Example 2-1 above was dissolved into 92 parts by weight of a mixed solvent consisting of dimethyl formamide/propylene carbonate (7:3) to thereby prepare a coating agent. A test piece of PI-T (thermoplastic polyimide resin) was preheated to 230° C. in an oven. Then, the test piece was immersed in the abovementioned coating agent for 10 sec. after which it was pulled out of the bath, and was dried at a room temperature. An electro static voltage was applied to the test piece at a temperature of 110° C.

Example 2-3

A test piece was prepared from a pressed sheet of a composite material consisting of hydrogenated nitrile rubber and zinc polyacrylate [Remark 2-2]. The surface of this test piece was washed with IPA, followed by electrostatic voltage application at a temperature of 80° C.

[Remark 2-1] Product of Mitsui-Toatsu Kagaku K.K. "BAREX 1043S" (acrylonitrile/acrylic ester copolymer)
[Remark 2-2] Product of Japanese Zeon K.K. "ZSC 2000N Series" (a composite material consisting of hydrogenated acrylonitrile/butadiene copolymer and zinc acrylate, with zinc acrylate content of approx. 30%)

TABLE 3

| Ex. No. | Combination (A) | Combination (B) | Base Material | Peeling Strength (kg/cm) | Test Results of Electroless Metal Deposition — Adhesivity of Coating for Electromagnetic Wave Shield |
|---|---|---|---|---|---|
| 2-1 | A/A | — | A/A sheet | 1.4–1.8 | 100/100 |
| 2-1* | " | — | " | 0.9–1.0 | 100/100 |
| 2-2 | " | — | PI-T | 1.4–1.5 | 100/100 |
| 2-2* | " | — | " | 1.0–1.2 | 100/100 |
| 2-3 | | Hydrogenated nitrile rubber | rubber per se | 0.8–1.0 | 100/100 |
| 2-3* | | Hydrogenated nitrile rubber | rubber per se | 0.3–0.4 | 100/100 |

Section 3 (Examples of Combination of Polymer A and Polymer B of Chemical Structure having Double Bond at a Portion Held Between Aromatic Substituent Groups in the Main Chain [Examples 2-1 to 2-3])

Example 3-1

2 parts by weight of SBS [Remark 3-1] and 3 parts by weight of SMA [Remark 1-13] were dissolved into 95 parts by weight of MEK to thereby prepare the coating agent.

The resin, to which the coating agent was applied, was ABS(1); and the temperature, at which the static voltage was applied, was 80° C.

Example 3-2

2 parts by weight of SBS [Remark 3-1] and 3 parts by weight of polyester type adhesive agent [Remark 1-2] were dissolved into 95 parts by weight of MEK to thereby prepare the coating agent.

The resin, to which the coating agent was applied, was PBT; and the temperature, at which the electrostatic voltage was applied, was 120° C.

Example 3-3

2 parts by weight of SBS [Remark 3-1] and 3 parts by weight of MAPB 1,4 [Remark 1-8] were dissolved into 95 parts by weight of MEK to thereby prepare the coating agent.

The resin, to which the coating agent was applied, was PC(2); and the temperature, at which the non-contact electrostatic voltage was applied, was 120° C.

Example 3-4

4 parts by weight of SBS [Remark 3-2] and 1 part by weight of benzoic acid were dissolved into 95 parts by weight of butyl acetate to thereby prepare the coating agent.

The resin, to which the coating agent was applied, was PC(1); and the temperature, at which the electrostatic voltage was applied, was 120° C.

Example 3-5

4 parts by weight of SBS [Remark 3-3] and 1 part by weight of mercapto benzothiazole were dissolved into 95 parts by weight of butyl acetate to thereby prepare the coating agent.

The resin, to which the coating agent was applied, was PS+PPE; and the temperature, at which the electrostatic voltage was applied, was 80° C.

Example 3-6

4 parts by weight of SIS [Remark 3-4] and 1 part by weight of mercapto benzothiazole were dissolved into 95 parts by weight of butyl acetate to thereby prepare the coating agent.

The resin, to which the coating agent was applied, was ABS(1); and the temperature, at which the electrostatic voltage was applied, was 80° C.

Example 3-7

4 parts by weight of SBS [Remark 3-1] and 1 part by weight of p-toluene sulfonic acid were dissolved into 95 parts by weight of MEK to thereby prepare the coating agent.

The resin, to which the coating agent was applied, was ABS(1); and the temperature, at which the electrostatic voltage was applied, was 80° C.

Example 3-8

1 part by weight of SBS [Remark 3-1], 1 part by weight of AS [Remark 3-5], and 3 parts by weight of SMA [Remark 1-13] were dissolved into 95 parts by weight of MEK to thereby prepare the coating agent.

The resin, to which the coating agent was applied, was ABS(1), ABS(2), (PS+PPE), heat-resistant ABS; and the temperature, at which the electrostatic voltage was applied, was 80° C. for ABS(1), ABS(2), (PS+PPE), while it was 120° C. for heat-resistant ABS and (PC+ABS)

Example 3-9

The coating agent was prepared in exactly the same manner as in Example 3-8 above, with the exception that, in place of SMA used in the preceding example, there was blended the polyester type adhesive agent [Remark 1-2].

The resin, to which the coating agent was applied, was (PS+PPE), PBT, and PC(1); and the temperature, at which the electrostatic voltage was applied, was 120° C.

Example 3-10

The surface of the injection molded test specimen of a resin composition obtained by melting and kneading 2 parts by weight of SBS [Remark 3-1] and 8 parts by weight of SMA [Remark 1-13] was wetted with MEK, immediately after which a negative voltage of 4 KV was applied by the non-contact method, and the specimen was dried with air at a normal temperature.

[Remark 3-1] Product of Asahi Kasei K.K. "TOUGH-PRENE 125" (SBS with styrene content of 40)
[Remark 3-2] Product of Asahi Kasei K.K. "SOLPRENE 411" (SBS with styrene content of 40%)
[Remark 3-3] Product of Asahi Kasei K.K. "SOLPRENE 414" (SBS with styrene content of 30%)
[Remark 3-4] Product of Nippon Synthetic Rubber K.K. "SIS 5000" (stylene/isoprene copolymer and thermoplastic elastomer, with styrene content of 15%)
[Remark 3-5] Product of Mitsui-Toatsu Kagaku "LIGHTAC-A" (acrylonitrile/styrene copolymer, with acrylonitrile content of 28%)

TABLE 4

| Ex. No. | Combination (A) | Combination (B) | Base Material | Peeling Strength (kg/cm) | Adhesivity of Coating for Electro-magnetic Wave Shield |
|---|---|---|---|---|---|
| 3-1 | SMS | SMA | ABS(1) | 1.4 | 100/100 |
| 3-2 | " | polyester type adhesive agent | PBT | 0.5–0.6 | 100/100 |
| 3-3 | " | MAPB 1,4 | PC(2) | 0.5–0.8 | 100/100 |
| 3-3* | " | " | PC(2) | 0.3–0.4 | 100/100 |
| 3-4 | " | benzoic acid | PC(1) | 0.2–0.4 | 100/100 |
| 3-5 | " | mercapto benzothiazole | PF + PPE | 0.2–0.3 | 100/100 |
| 3-6 | SIS | mercapto benzothiazole | ABS(1) | 0.3 | 100/100 |
| 3-7 | SBS | p-toluene sulfonic acid | ABS(1) | 0.3–0.4 | 100/100 |
| 3-8 | SBS + AS | SMA | ABS(1) | 1.3–1.4 | 100/100 |
| | " | " | ABS(2) | 1.2–1.3 | 100/100 |
| | " | " | PS + PPE | 0.8–0.9 | 100/100 |
| | " | " | heat-resist ABS | 1.3–1.4 | 100/100 |
| | " | " | PC + ABS | 0.6–0.8 | 100/100 |
| 3-9 | " | polyester type adhesive agent | PS + PPE | 0.7–0.8 | 100/100 |
| | " | polyester type adhesive agent | PBT | 0.8–0.9 | 100/100 |
| | " | polyester type adhesive agent | PC(1) | 0.7–0.9 | 100/100 |
| 3-10 | SBS | SMA | resin per se | 1.2–1.6 | 100/100 |

EXAMPLE 4

This example is on the non-contact application of the electrostatic voltage to one and the same test specimen with a space interval between the pole plate and the surface of the test specimen being varied.

In Example 3-8, the coating agent was applied onto the ABS(1) test specimen, and the non-contact application of the static voltage was effected with the space interval between the pole plate and the surface of the test specimen having been varied 1 mm, 2 mm and 4 mm, respectively, the results of which are shown in Table 5 below. The voltage applied was a constant high voltage of 6 KV. The peeling strength of the coating was indicated in comparison with the case of the contact application of the voltage.

TABLE 5

| Space Interval Between Pole Plate and Test Specimen | Peeling Strength of Electroless Metal Deposition Coating (kg/cm) |
|---|---|
| Contact Application | 1.3–1.4 |
| 1 mm | 1.0–1.2 |
| 2 mm | 1.2–1.3 |
| 4 mm | 1.2–1.3 |

EXAMPLE 5

This example was done on one and the same test specimen with the temperature for voltage application and applied voltage having been varied.

The coating agent prepared in Example 1-9 was applied onto the (PC+ABS) test specimen, and then a high tension voltage was applied onto it with a space interval between the pole plate and the surface of the test specimen having been kept 1 mm constant, and with the temperature for the voltage application as well as the applied voltage having been varied. The results are shown in Table 6 below. The unit of measurement of the peeling strength is "kg/cm". For the sake of reference, the peeling strength of the coating of a comparative test specimen without voltage application was 0.8 kg/cm.

TABLE 6

| Temp. for Voltage Application | Peeling Strength (kg/cm) | | |
|---|---|---|---|
| | Applied Voltage | | |
| (°C.) | 2 KV | 4 KV | 6 KV |
| 80 | 0.9 | 1.0–1.2 | 1.0–1.2 |
| 110 | 0.9–1.2 | 1.2–1.4 | 1.0–1.1 |
| 140 | 1.0–1.1 | 1.3 | 0.9 |

As has so far been described in the foregoing, the resin composition for the electroless metal deposition and the method for such electroless metal deposition are of such construction that the corrosion preventive step, which has been effected in the convetional metal deposition method, can be dispensed with. Therefore, electroless metal deposition according to the present invention can be readily effected on extremely wide range of materials. Furthermore, it is possible to effect the electroless metal deposition on those materials which are difficult to be sujected to the corrosion treatment, such as, for example, BMC (butadiene/ maleic anhydride copolymer), SMC (styrene/malic anhydride copolymer), etc. of unsaturated polyester, thermosetting resins like melamine resin, phenolic resin, epoxy resin, and so on, or those resins called "super engineering plastics" such as polyimide, liquid crystal resin, and so forth, in an extremely easy manner, without taking much time and without sacrificing the inherent properties of the resins for the corrosion treament by modifying them to become easily corrosive. On account of this, the present invention is expected its application to the manufacture of those electromagnetic wave shielding materials. Also, it is feasible to apply the method of the present invention to those wooden products by subjecting them to the surface treatment, followed by coating them with paint or primer.

Although in the foregoing the present invention has been described in specific details with reference to preferred examples thereof, it should be understood that these examples are illustrative only and not so restrictive, and that any changes and modifications may be made to those materials used and the conditions for the process steps, without departing from the spirit and scope of the invention as recited in the appended claims.

What is claimed is:

1. A method for electroless metal deposition, which comprises steps of:

forming, on the surface of a non-conductive body to be plated, a coating of a resin composition for the electroless metal deposition containing therein a polymer (A) having a chemical structure of at least one compound selected from the group consisting of the below-listed (a), and at least one compound selected from the group of the below-listed (b)1 and (b)2;

applying a negative electrostatic voltage to said coating of said resin composition at a temperature level above the glass transition point of said resin composition;

thereafter removing the applied voltage at a temperature lower than said glass transition temperature; and successively carrying out the metal deposition steps inclusive of the catalyst imparting step and the activating step:

(a) a chemical structure, in which a part of hydrogen in the main chain of polymer is substituted with the halogen group or the nitrile group, and a chemical structure having a double bond at a portion held between the aromatic substituents in the main chain of the polymer; and (b)1 a polymer (B) having a functional group which is capable of forming a metal salt; and (b)2 a low molecular weight compound (C) having a functional group which is capable of forming a metal salt, and having complete miscibility with said polymer (A) to form one phase.

2. A method for electroless metal deposition, which comprises steps of:

applying, onto the surface of a shaped article of resin which is made up of a resin composition for the electroless metal deposition containing therein a polymer (A) having a chemical structure of at least one compound selected from the group consisting of the below-listed (a), and at least one compound selected from the group of the below-listed (b)1 and (b)2, a negative electrostatic voltage at a temperature higher than the glass transition point of said resin composition;

thereafter, discarging the applied voltage at a temperature lower than said glass transition temperature; and successively carrying out the catalyst imparting step and the activating step:

(a) a chemical structure, in which a part of hydrogen in the main chain of polymer is substituted with the halogen group or the nitrile group, and a chemical structure having a double bond at a portion held between the aromatic substituents in the main chain of the polymer;

(b)1 a polymer (B) having a functional group capable of forming a metal salt; and (b)2 a low molecular weight compound (C) having a functional group capable of forming a metal salt, and having complete miscibility with said polymer (A) to form one phase.

3. A method for electroless metal deposition according to claim 1, wherein the coating of said resin composition is dried through non-contact application of the electrostatic voltage, in the state of the solvent remaining on the surface of said non-conductive body to be metal deposited, thereby forming said coating of the resin composition.

4. A method for electroless metal deposition according to claim 2 wherein the coating of said resin composition is dried through non-contact application of the electrostatic voltage, in the state of the solvent remaining on the surface of said non-conductive body to be metal deposited, thereby forming said coating of the resin composition.

* * * * *